(12) United States Patent
Horwitz

(10) Patent No.: US 6,922,324 B1
(45) Date of Patent: Jul. 26, 2005

(54) REMOTE POWERING OF ELECTROSTATIC CHUCKS

(76) Inventor: Christopher M. Horwitz, 2200 Beechwood Blvd., Pittsburgh, PA (US) 15217

( * ) Notice: Subject to any disclaimer, the term of this patent is extended or adjusted under 35 U.S.C. 154(b) by 816 days.

(21) Appl. No.: 09/612,891

(22) Filed: Jul. 10, 2000

(51) Int. Cl.[7] .............................................. B23B 31/28
(52) U.S. Cl. ....................... 361/234; 361/143; 361/145; 361/144; 279/128
(58) Field of Search ................................ 361/143–145, 361/179, 234

(56) References Cited

U.S. PATENT DOCUMENTS

| | | | | |
|---|---|---|---|---|
| 4,354,149 A | * | 10/1982 | Armond et al. ................. 307/66 |
| 5,504,485 A | * | 4/1996 | Landt et al. ................... 342/42 |
| 6,005,376 A | * | 12/1999 | Mett et al. .................... 323/275 |
| 6,032,546 A | * | 3/2000 | Stone ........................... 307/104 |
| 6,075,375 A | * | 6/2000 | Burkhart et al. .............. 324/662 |
| 6,081,414 A | * | 6/2000 | Flanigan et al. .............. 361/234 |

* cited by examiner

Primary Examiner—Brian Sircus
Assistant Examiner—Isabel Rodriguez

(57) ABSTRACT

Substrates such as silicon wafers, flat panel displays, and hard disk drive head substrates are electrostatically gripped using power derived from a physically separated source. Noncontacting coupling permits operation in vacuum as a result of its efficient energy conversion. Bidirectional communications between a controller and the remote gripper electronics along its power coupling lines is enabled. Inclusion of a communications link allows monitoring of system status and full control over the substrate sensing, grip, and release processes. The system of the present invention provides freedom from rf bias filtering considerations, and enables installation of grippers on robot arms without stretching, bending, or sliding electrical connections.

32 Claims, 7 Drawing Sheets

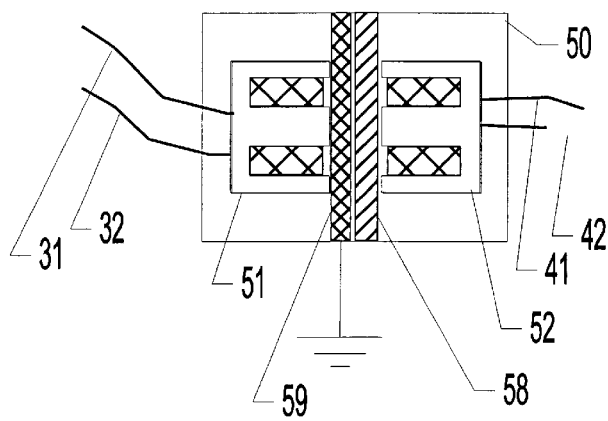
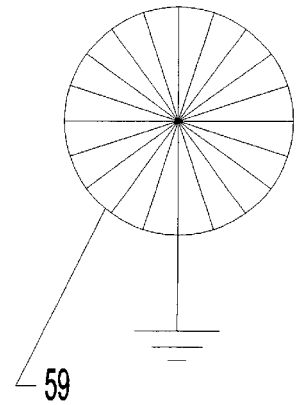
Fig. 3a                Fig. 3b
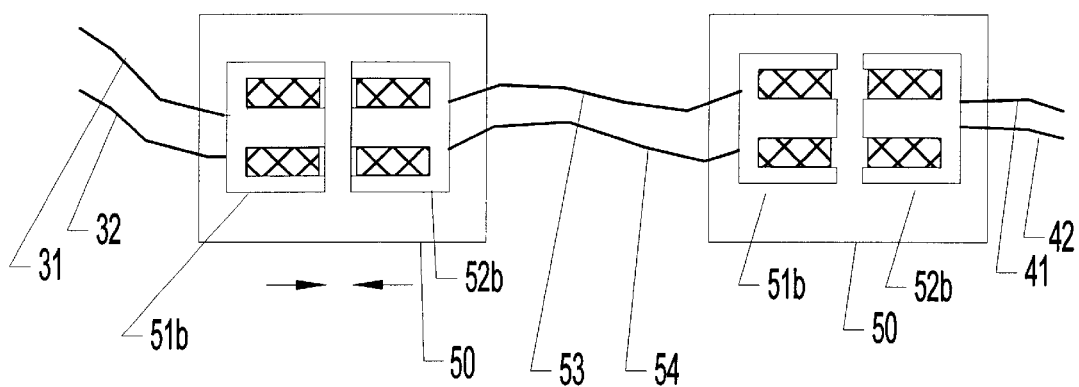
Fig. 3c

REMOTE POWERING OF ELECTROSTATIC CHUCKS

FIELD OF THE INVENTION

This invention is a system for electrostatically gripping delicate substrates such as silicon wafers using an electronic package consisting of two units. The first unit is an efficient high voltage generator system which is mounted close to the gripping device. The second unit provides a control interface and power for the first unit. The two units exchange communication signals over their power connection. The two units may be directly connected in simple installations which do not require isolation or movement of the gripper element. In the more common case of substrate processing in controlled atmospheres or vacuum, the units are linked by at least one noncontacting coupling device.

BACKGROUND INFORMATION

Semiconductor and other delicate substrates may be electrostatically gripped in air or vacuum to minimise slippage while being accelerated during robotic transfer or alignment. Gripping combined with gas backfill on the rearside of substrates is also used to increase machine processing rates through the improved temperature control afforded by thermal conductivity of the backfill gas. Often such vacuum operation employs radio-frequency (rf) excitation to generate plasma discharge bombardment of the substrate, requiring the gripper to be at high rf and induced dc voltages. Such gripping has been performed using high voltage generators mounted remotely from the gripper, then connected by wires, rf filters, feedthroughs, slip rings, and other direct electric connection methods to the gripper. An example of such connections is given in U.S. Pat. No. 5,646,814 "Multi-Electrode Electrostatic Chuck" by S. Shamouilian, S. Broydo and M. Birang. Such connections limit the possible motions of the gripper, the ability of the remote electronics to sense signals at the gripper potential, and also the available rf excitation levels and frequencies due to the restricted range of rf filters. In addition bulky filter and rotary coupling hardware is often required at the crowded gripper site.

Vacuum feedthroughs, rotary slip rings, and bending or rotating wiring are often used to couple power from the high voltage drive to a gripper inside a vacuum chamber. Vacuum feedthroughs can exhibit arcing from high voltage points in vacuum feedthroughs as the pressure of gas passes through intermediate easily ionized regimes. Slip rings have been noted for their unreliability of slip ring contact, as noted in U.S. Pat. No. 5,994,788 "Device for the contactless transfer of signals between two vehicle parts" by K. Dobler, E. Zabler, A. Dukart and T. Hermann. An example of slip ring reliability improvement is given in U.S. Pat. No. 3,938,029 "Low noise dc power supply system for electronics on a rotating assembly" by P. B. Wagner and J. W. Telfordm further type of low noise slip ring using orientation-sensitive liquid mercury contacts is made by Mercotac Inc. of Carlsbad, Calif. 92009 USA. However these slip ring improvements are incompatible with high speed signal transmission and vacuum operation, respectively.

A further inconvenience of rf filters and long wiring connections relates to capacitive sensing of substrate grip status, used in the control of the electric field levels at the surface of electrostatic grippers. Examples of such sensing are given in U.S. Pat. No. 5,103,367 "Electrostatic chuck using ac field excitation" by C. M. Horwitz and S. Boronkay; and U.S. Pat. No. 5,325,261 "Electrostatic chuck with improved release" by C. M. Horwitz. Sensitivity to substrate grip status varies when rf filter frequency settings are altered or when cables move, requiring readjustment of sensing parameters or resulting in inconsistent substrate sense signal levels.

If it were possible to place the drive electronics module at the gripping device, and to power and control it remotely, such limitations of wiring and filter connections would be removed. Remote powering of a gripping power supply may be accomplished via light beams, radio waves, heat radiation, mechanical coupling, and other such means of energy transfer. Only some of these powering methods are sufficiently efficient to be used in vacuum applications; for example photocells are rarely more than 50% efficient even for monochromatic illumination. Such less efficient methods would be viable in non-vacuum applications where air cooling is available.

Operation of gripping devices and their high voltage drive unit in vacuum, which does not allow gas conductive or convective removal of heat can result in undesirable overheating of the electronics if energy transfer is not efficient or the remote electronics module dissipates a high heat load relative to its heat radiating size. In addition space is limited in most vacuum chambers so a small size of all components is required, which further constrains the allowable heat load. Electrostatic gripping thus requires an efficient method of remotely powering a high voltage electrostatic grip module. In addition control of the module via a two-way communication link is desirable to both initiate actions and obtain feedback on system status.

A further and more popular method of efficient energy transfer uses rotary coupling transformers. Some recent examples of the use of such transformers to couple energy and information between two isolated regions are described in U.S. Pat. No. 5,691,687 "Contactless magnetic slip ring" by H. Kumagai; the Dobler patent referenced above; U.S. Pat. No. 6,032,546 "System for transferring electrical power between non-contacting elements in relative motion" by N. Stone; U.S. Pat. No. 6,012,736 "Vehicle steering column control system" by J. E. Hansen, R. E. Hubbell, W. J. Janutka, B. T. Pier, S. A. Reid, W. L. Rutchik; U.S. Pat. No. 5,824,891 "Method and apparatus for efficiently phase modulating a subcarrier signal for an inductively coupled transformer" by M. B. Monson; U.S. Pat. No. 5,856,710 "Inductively coupled energy and communication apparatus" by J. S. Baughman and K. C. Ross. These methods describe systems with various degrees of power transfer efficiency and communication effectiveness between the coupled circuits. The power coupling devices used to isolate against both radio frequency and dc high voltages should preferably employ a simple construction with a relatively large gap of 2–3 mm which can be filled with high voltage insulation and an electrostatic shield. Thus constructions such as in the Kumagai and Stone patents referenced above which rely on small gaps such as 0.0005 to 0.005 inches in the case of Stone, or such as the Dobler patent referenced above using dished and interleaved magnetic elements, would not be applicable.

It is thus one of the aims of this patent to provide means of removing the need for direct wire connections and rf filters while permitting efficient power transfer for substrate gripping with a power drain sufficiently low that overheating in vacuum does not occur.

Another aim of this patent is to provide means of communication between substrate and control unit so that full status monitoring, accurate substrate position sensing, and control are maintained.

Another aim is to provide power coupling means with sufficiently large gap between the coupled elements to allow rf isolation and electrostatic shielding to be performed. Such a power coupling could also be used to couple across a vacuum window material, eliminating the need for a wired vacuum feedthrough.

Another aim is to provide a non-contact power coupling means that is sufficiently compact to fit inside rotary bearings, or that allows linear motion, between moving robotic segments.

SUMMARY OF THE INVENTION

According to the present invention, there is provided electronic circuitry in the following form:

1. A first unit mounted close to an electrostatic gripping device which provides high voltage output with high efficiency, and which receives power from, and exchanges information with, a second unit. This first unit may include backup power in the form of a capacitor or battery to maintain power during periods of disconnection from the second unit.
2. A second unit mounted in a place suitable for connection to external control signals and general system power wiring, separate from the electrostatic gripping device and the first unit. This second unit transmits power to the first unit, as well as exchanging information between external control signals and the first unit. Power transmission is preferably performed in a fashion that can efficiently drive large-gap transformers, as described below.
3. A connection means between the first and second units which can perform a variety of functions as listed below.

In the simplest embodiment of this invention a pair of wires may be used. This would be useful where the gripping device is in atmospheric air, is accessible, and is not driven to elevated voltages. A variation on this embodiment would connect this wire pair to various plug-in stations in an assembly line, so that the gripper device and the first electronic unit may move from station to station with the substrate being processed. In this case a backup capacitor or battery storage would be incorporated in the first unit and also move with the gripper.

In other embodiments of this invention, non-contact energy transfer across at least one gap is used to couple power and signals between the first and second units, for purposes which include vacuum feedthrough, rf and dc bias voltage isolation, and relative motion of system components.

In accordance with a more limited aspect of such non-contact embodiments, the non-contact energy transfer uses transformers with various gap sizes and configurations. In these cases, the second unit can use adaptive circuitry to ensure operation without adjustment as the gap geometry alters.

The present invention provides the following benefits:

1. An electrostatic gripping system which provides flexible handling equipment design for moving delicate substrates between workstations.
2. The provision of safe low voltage connection terminals for an electrostatic gripper, minimising the likelihood of operator electric shock and of electric discharge in vacuum.
3. The ability to attach electrostatic grippers on a moving platform such as a rotary shaft, translation stage, or robot arm without the poor reliability of slip rings, and moving or twisting cables.
4. The ability to place an electrostatic gripper, its first unit high voltage electronics, and its associated coupling transformer coil in vacuum; while keeping the second control unit with its associated coupling transformer coil in air. With a suitable nonmetallic tube or plate in between the two coils forming part of a vacuum enclosure, there is no need for a bulky and expensive high voltage vacuum feedthrough with its associated plugs and sockets.
5. The ability to place an electrostatic gripper, its first high voltage electronic unit, and its associated coupling transformer coil at an elevated potential, which may be any combination of rf, dc, and pulse waveforms; while keeping the second control unit with its associated coupling transformer coil at ground potential. With electrical insulation and if required an electrostatic screen in between the two coils, there is no need for a bulky and expensive remote powering system with fiber optic controls, rf filter boxes, or dc level translation circuitry. The reference voltage for the first high voltage electronics unit can be connected to the gripper system, resulting in the grip electrode potentials automatically tracking the dynamically changing gripper system voltage.
6. Because of the close and fixed connection between a gripper and the first high voltage drive unit, variations in substrate sensing signals are minimised, permitting more accurate and reproducible sense levels. Other parameters such as substrate and chuck temperatures, detailed voltage readings on substrates and in the plasma, and many other such parameters that are normally difficult to measure in the presence of high rf voltages, are easily monitored using additional inputs and outputs in the first high voltage drive unit.

Additonal benefits of this invention will become apparent to those skilled in the art upon reading and understanding this specification.

BRIEF DESCRIPTION OF THE DRAWINGS

FIG. 3a illustrates a cross-sectional view of an embodiment of a screened isolating coupling of the present invention.

FIG. 3b illustrates a plan view of the screen of FIG. 3A.

FIG. 3c illustrates a cross-sectional view of an embodiment of chained couplings of the present invention.

DESCRIPTION

Figure 1:
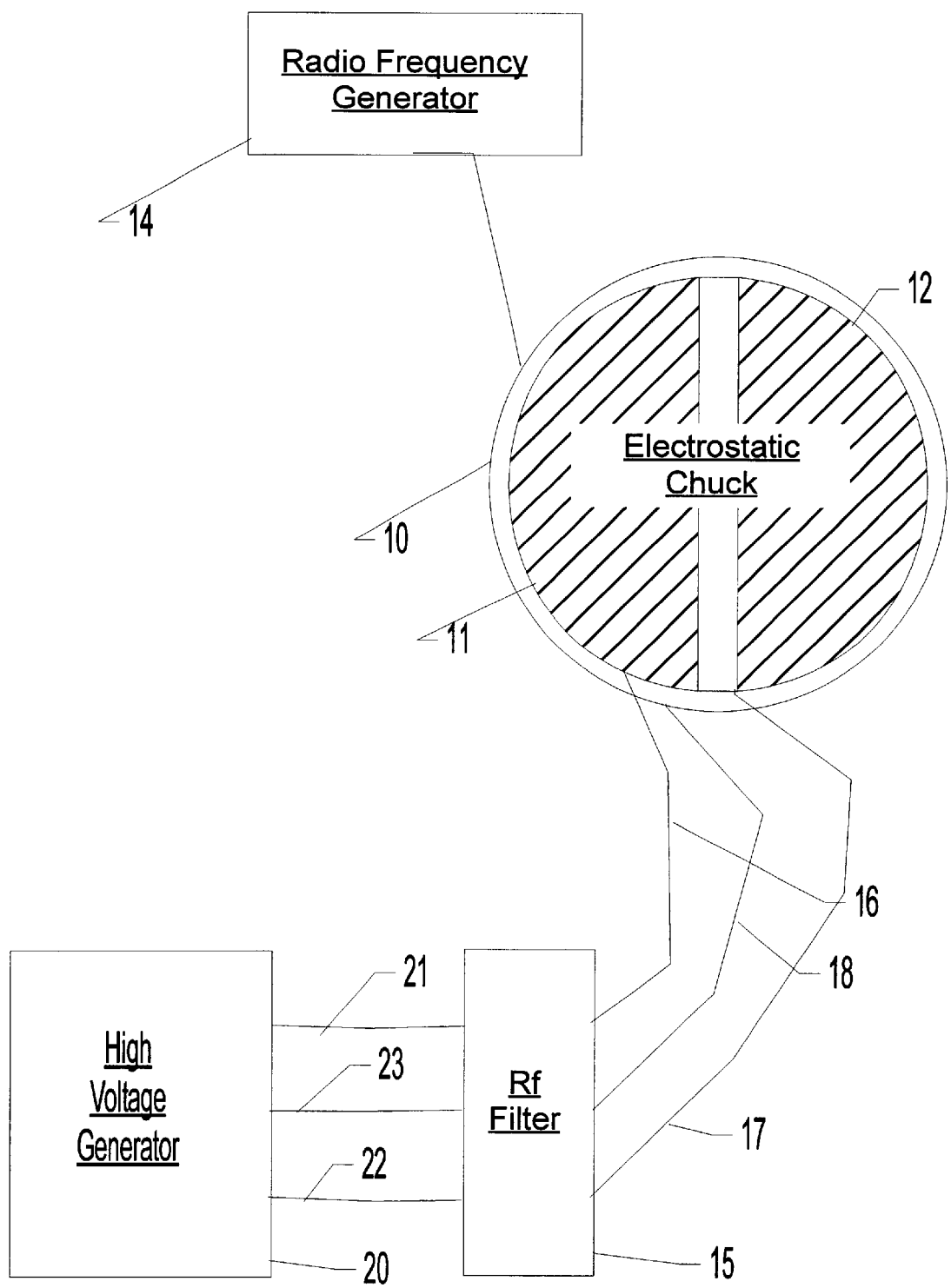
FIG. 1 is a drawing of typical prior art showing an electrostatic chuck gripper, a high voltage drive unit, and wiring connecting the two through a typical interface, in this case an rf filter. An rf generator is connected to the chuck body to enable plasma processing of substrates placed on the chuck.

With reference to FIG. 1 the prior art being here improved upon is shown in a typical form, with an electrostatic chuck gripper comprising a base electrode 10, and individual gripping electrodes 11 and 12. There are other components of an electrostatic chuck such as interleaving dielectric layers beneath the gripping electrodes and the substrate which are not relevant to this discussion, and are not shown. Such a gripper would be suitable for vacuum plasma processing of semiconductor wafers, hard disk drive head substrates, and other finely patterned materials. For the purposes of such processing the base electrode 10 must be connected to a source of rf power 14, and the gripping electrodes 11 and 12 must substantially track the rf potential of the base electrode 10. Thus the electrode connection wires 16 and 17 must also have rf potential on them, together with the electrostatic gripping potentials that are used to attract substrates to the surface of the electrostatic chuck. The rf filter 15 then is used to remove the impressed rf potential, and may consist of circuits as simple as a series resistor followed by a bypass capacitor, or contain inductor-capacitor combinations to filter specific rf frequencies. Such filters will in general compromise any control or sensing signal that may be desired to be impressed upon the electrode wires 16 and 17 for the purposes of sensing chuck or substrate status. Wires 16 and 17 feed through the filter into wires 21 and 22 which are driven by the high voltage generator 20. In cases where the chuck average dc bias potential is required as a reference level for the high voltage generator 20, connection 18 may be made either as shown to the chuck baseplate 10 or to a voltage which tracks the chuck dc bias potential. In case of connection to the baseplate, the signals on wire 18 are again passed through filter 15 before being connected through wire 23 to the high voltage generator 20.

Similar electrostatic electrode connections are required by other prior art implementations. The examples which follow delete the rf generator 14 and change the function of the rf filter 15 into a more generalized coupling device. For example, where a chuck is placed on a moving stage in vacuum the filter 15 would be replaced by a vacuum feedthrough. For vacuum robotic applications the relatively thick and circular chuck base 10 could be replaced by a thin rectangular gripper paddle, and the rf filter 15 could become a vacuum feedthrough combined with slip rings. The wiring 16, 17 and 18 in both cases would be traced along the robot arms or stage motion path, and is often subject to flexure. In some atmospheric pressure applications the high voltage wiring 21 and 22 is taken directly to the chuck electrodes 11 and 12, such direct connections not employing an intermediate coupling device 15.

Figure 2:
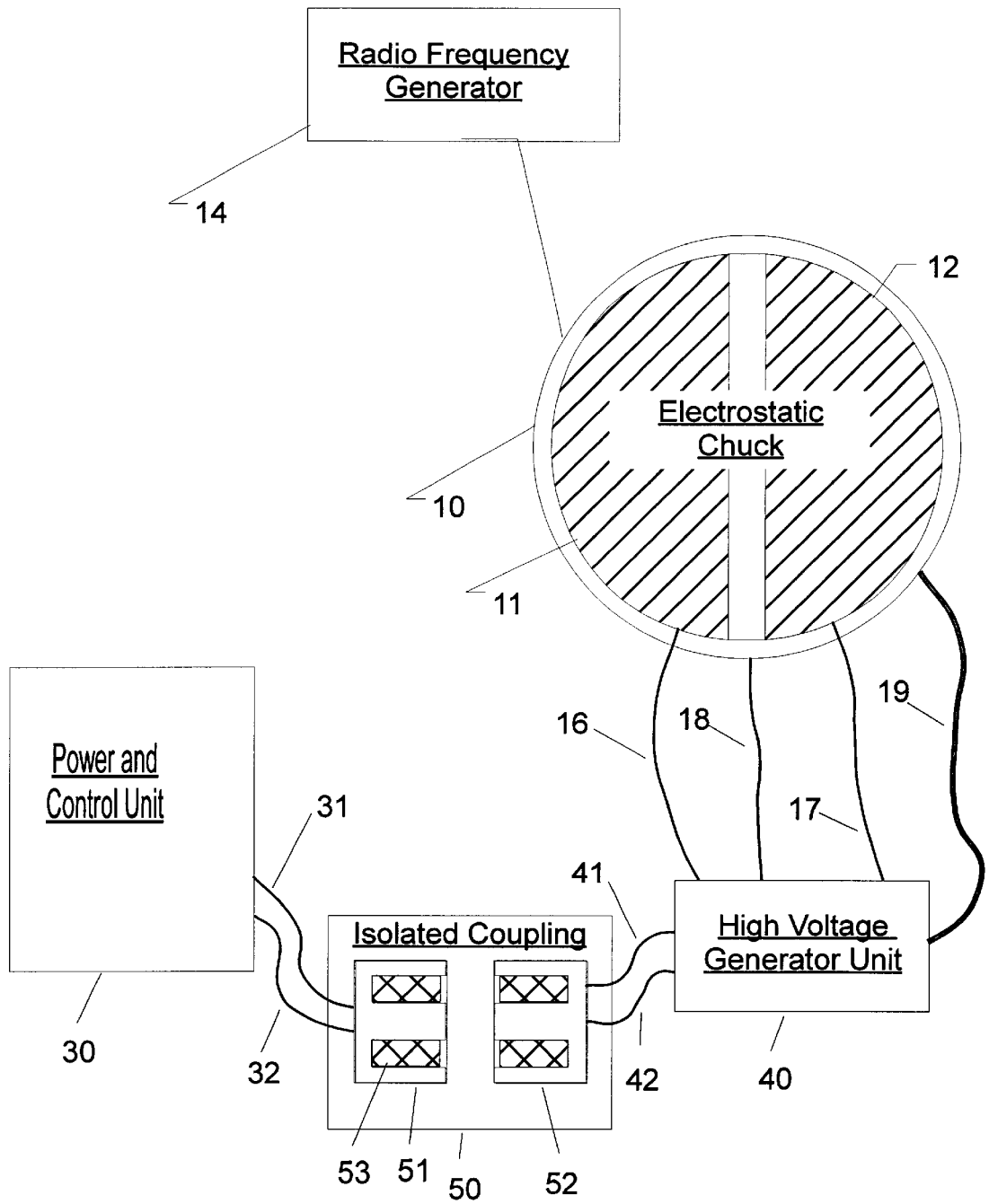
FIG. 2 is a drawing of an embodiment of the present invention as applied to an rf plasma processing case, showing the first high voltage generator unit attached to a chuck, a second power and control electronics unit situated more remotely from the chuck, and an isolated coupling used to communicate power and signals between the units.

Referring to FIG. 2 which shows one embodiment of the present invention, the electrostatic chuck base 10 is again connected to an rf generator 14. The chuck electrodes now connect directly to the high voltage generator unit 40 which is powered and controlled through wires 41 and 42. Chuck connections shown in FIG. 2 are the reference baseplate connection 18 which here causes the voltage of the entire electronics unit 40 to follow the baseplate 10 rf voltage, and the high voltage gripping electrode wires 16 and 17. An additional connection 19 is added to indicate the ability of the electronics unit 40 to power and receive data from a variety of sensors, permitting measurement of various chuck and substrate parameters such as temperature, substrate location, gas pressure, bias voltages in the plasma, current and voltage levels in the chuck or substrate, substrate contact, and many other such parameters that are currently difficult and expensive to accurately sense due to the interfering effects of the large rf voltages present. The isolated coupling 50 contains transponder elements 51 and 52 which in a more limited embodiment of this invention are transformer cores with windings 53 placed into ferrite or other magnetic core material, shown as pot cores in FIG. 2. There are other elements in this coupling which will be described in FIGS. 3a and 3b. The transponder element 51 is connected through wires 31 and 32 to the power and control unit 30 which is at control signal and system power voltage levels, typically within 20V of ground. The transponder element 52 is connected to the high voltage generator unit 40 through wires 41 and 42 which are at the potential of the chuck baseplate 10, as modified by the signal and power voltages impressed across wires 41 and 42. The signal and power voltages across 41 and 42 are typically between 5 and 60V, being the range of voltages that can be efficiently rectified by high speed Schottky diodes and converted into usable system power voltages.

Figure 3D:
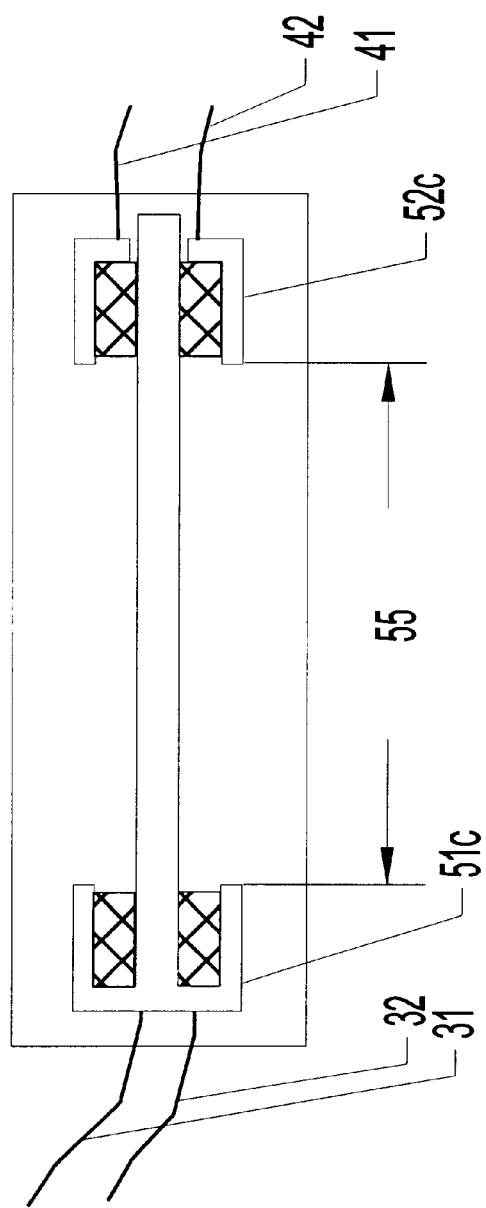
FIG. 3d illustrates a cross-sectional view of an embodiment of linear translation of transformer couplings of the present invention.

Detailed views of some types of isolated couplings are shown in FIGS. 3a–3d. A coupling suitable for use in systems exhibiting a high rate of change of gripper voltage such as pulsed high voltage ion implantation or rf plasma processing is shown in FIG. 3a and FIG. 3b. In these cases the small capacitance of the gap in between the transponder elements 51 and 52 permits high noise voltages to be developed in the wires 31 and 32 which may interfere with proper operation of the second power and control electronics unit 30. Thus in addition to a high voltage insulating sheet of material 58 such as TetraFluoroEthylene or Alumina which is able to withstand the applied voltage without arcing or damaging overheating, a screen 59 may be intersposed on the low-voltage transponder 51 side composed of grounded metallic elements formed in such a fashion as to be an electrostatic screen but not cause power or signal eddy current losses in the case of transformer core transponders, or excessive optical losses in the case of transponders using light beams to communicate signals and power. A typical radial fan formation of metal wires for screen 59 suitable for transformer transponders is shown in cross section in FIG. 3a, and in plan view in FIG. 3b.

Chained couplings are indicated in FIG. 3c by two couplings, interconnected by wires 53 and 54. Experiments have shown that chained systems can impose limitations on coupling design with transformer ferrite pot core transponder elements, because the tolerable gap size 55 must be divided among the various elements of the chain if power losses are to be held to the same level as would be obtained with a single coupling element. Hence the transponder elements 51b and 52b are shown schematically in FIG. 3b to have a smaller gap size 55 than in FIGS. 3a, 3b and FIG. 2. For example, a system exhibiting a given power transmission efficiency with a single coupling gap of 3 mm between transformer ferrite cores of 20 mm diameter will exhibit a similar efficiency if other core gaps in a chain of three couplings are held below 1 mm. Smaller cores tolerate proportionally smaller gap sizes, and larger cores tolerate proportionally larger gaps due to the linear geometric scaling of the intersection of one transponder core's magnetic field lines by the other.

All of the above described couplings using either light transmission or pot core transformer transponders are capable of coupling between mutually rotating members or between two different atmospheres such as air and vacuum, but with pot core couplers limited in gap sizes allowable. That limitation can be reduced using a form of coupling shown schematically in FIG. 3d which is suitable for use in systems where there is limited linear translation between the two coupled systems. The transformer transponder core 51c is extended with a central rod, and the transponder core 52c is allowed to pass over this rod, permitting energy coupling which decreases as the gap 55 is increased, but at a much slower rate than in the geometries of FIGS. 3a through 3c.

Practically tested gap sizes have varied between 0.2 mm and 4 mm using ferrite cup cores between 10 mm and 20 mm diameter, with the maximum allowable gap increasing as core diameter increases. Linear translation of coupled transformer coils up to several cm "gaps" has been attained with a rod-style core geometry. For rf isolation the transformer gap would be filled with a material that tolerates high rf fields without destructive overheating, such as TetraFluoro-Ethylene or Alumina ceramic. In addition for additional screening of high rf voltages, an electrostatic shield configured to minimize magnetic coupling may be placed close to the transformer core attached to the second unit.

Other geometries and conversion systems can be constructed to achieve any desired travel length, but with attendant coupling efficiency tradeoffs. For example, a coil 51 may be formed as a long narrow rectangular structure along the path of travel, and the other coil 52 formed as a smaller coil held at a fixed distance from the coil 51. In such a case leakage of magnetic field from the larger coil can be resonated by the driving circuit as will be described, but circuit losses will be higher than for a more compact structure. Optical and other radiation beam transponders are limited by beam divergence and conversion efficiency rather than magnetic circuit losses, and exhibit different tradeoffs.

The above descriptions of coupling transformer types shows that a great variation in coupling geometries, and hence in electrical performance, will occur both between different designs and in the presence of relative linear motion. It is desirable to be able to couple into all such configurations without adjustment of the powering electronics unit. This patent describes a type of adaptive drive that enables power transfer into variable coupling configurations, while permitting modulation of the power voltage to yield data transfer from the second power and control unit to the first high voltage unit. The concept is based upon a feedback system which seeks the resonant frequency of the circuit comprising the lumped magnetising inductance of the coupling coils, and output capacitances in the drive circuit. In addition the concept features duty cycle control of the drive waveform to both permit data transfer and set optimum power output levels.

Figure 4:
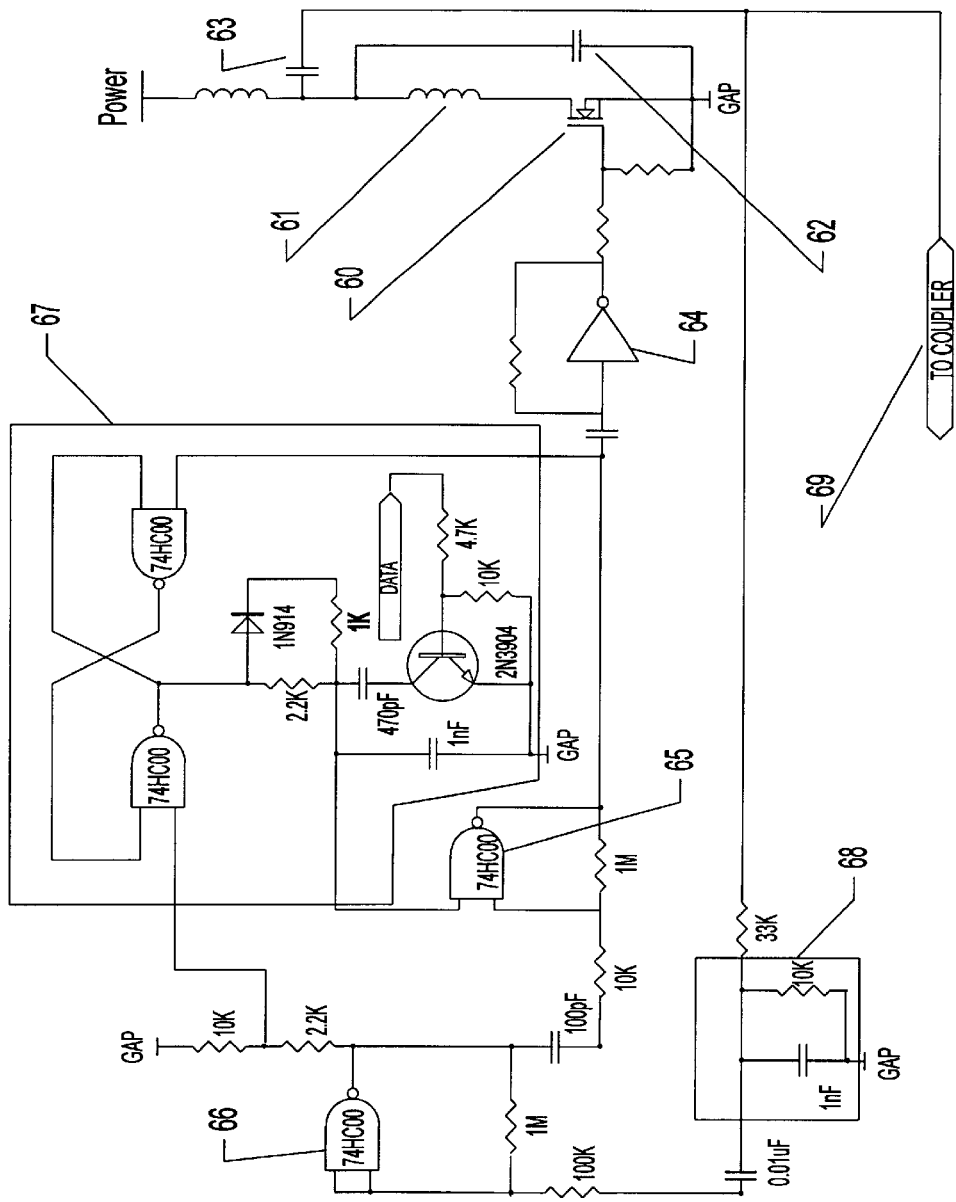
FIG. 4 illustrates a schematic representation of an embodiment of an adaptive coupling transformer power drive of the present invention.

An embodiment of the above concept is shown in FIG. 4 which enables adaptive drive into varying coupler geometries, and also permits power levels from 1 W to 25 W to be coupled efficiently through small chained transformer pot cores in a robot arm. A switch element 60 forms part of a linear amplifier comprising logic gates 64, 65, and 66 which are biased linearly until large-amplitude oscillations build up. Feedback via a phase shift and signal level reduction network 68 completes the positive feedback chain. The operating frequency is mainly determined by the capacitors 62 and 63, which resonate with inductance 61 and the leakage and magnetising inductance expressed by the coupling transformers at the power output node 69. The circuitry denoted by 67 controls the switch 60 "on" time after the oscillation amplitude builds up to a high level, and the logic gates cease to operate in the linear mode. The "on" time is controlled by the discharge time of two parallelled capacitors, one of which is switched by a data stream to yield amplitude modulation of the output power waveform.

The efficiency of high voltage generation in the first unit attached to the gripping device is especially important when the unit is mounted in vacuum, as on the end of an articulated robot arm. Since power loss in vacuum is governed mainly by radiation, expressed approximately (in the presence of various surface emittances) by the Stefan-Boltzmann formula $P=\epsilon A\sigma[T^4-T^4_{amb}]$ where P is the power dissipated, $\epsilon$ is the emittance of the surface which ranges from 0 for perfect mirrors to 1 for black surfaces, T is the temperature of the unit in vacuum and $T_{amb}$ the ambient temperature (both in degrees K), $\sigma$ is the Stefan-Boltzmann constant and A the area of the unit. Typical results for small palm-sized unit enclosed in an anodised aluminum housing yield a temperature of 60 degrees C. for room temperature ambients and 2 W power dissipation. This temperature is within an acceptable range of circuit operation. However doubled power dissipation would result in destructive overheating of the electronics. Hence high efficiency operation at the required high voltage drive levels is required. Bipolar electrostatic chucks with two gripping electrodes additionally require two outputs of opposite polarity. Finally, for many chuck styles the applied electrode voltages must be reversible and finely controlled to attain good grip and release performance, as described in the Horwitz patent referred to earlier.

High voltage generation may be accomplished as shown in a circuit diagram in the Horwitz patent referred to above, using transformers with a large number of secondary turns. Such transformers exhibit capacitive losses at their high drive frequencies which can be as high as 10 W for a 6 kV output. The same circuit diagram shows how polarity switching may be achieved using resistor loads across two stacked, opposite polarity high voltage generators. Again, the resistor loads introduce power losses, in this case often 2 W at 6 kV for typical electrostatic chuck drive applications requiring low drive current but approx. 100 ms response time constant while driving the nanoFarad-scale chuck capacitances in most electrostatic chucks. Thus prior art drive circuits exhibit losses too great for the present application.

Figure 5:
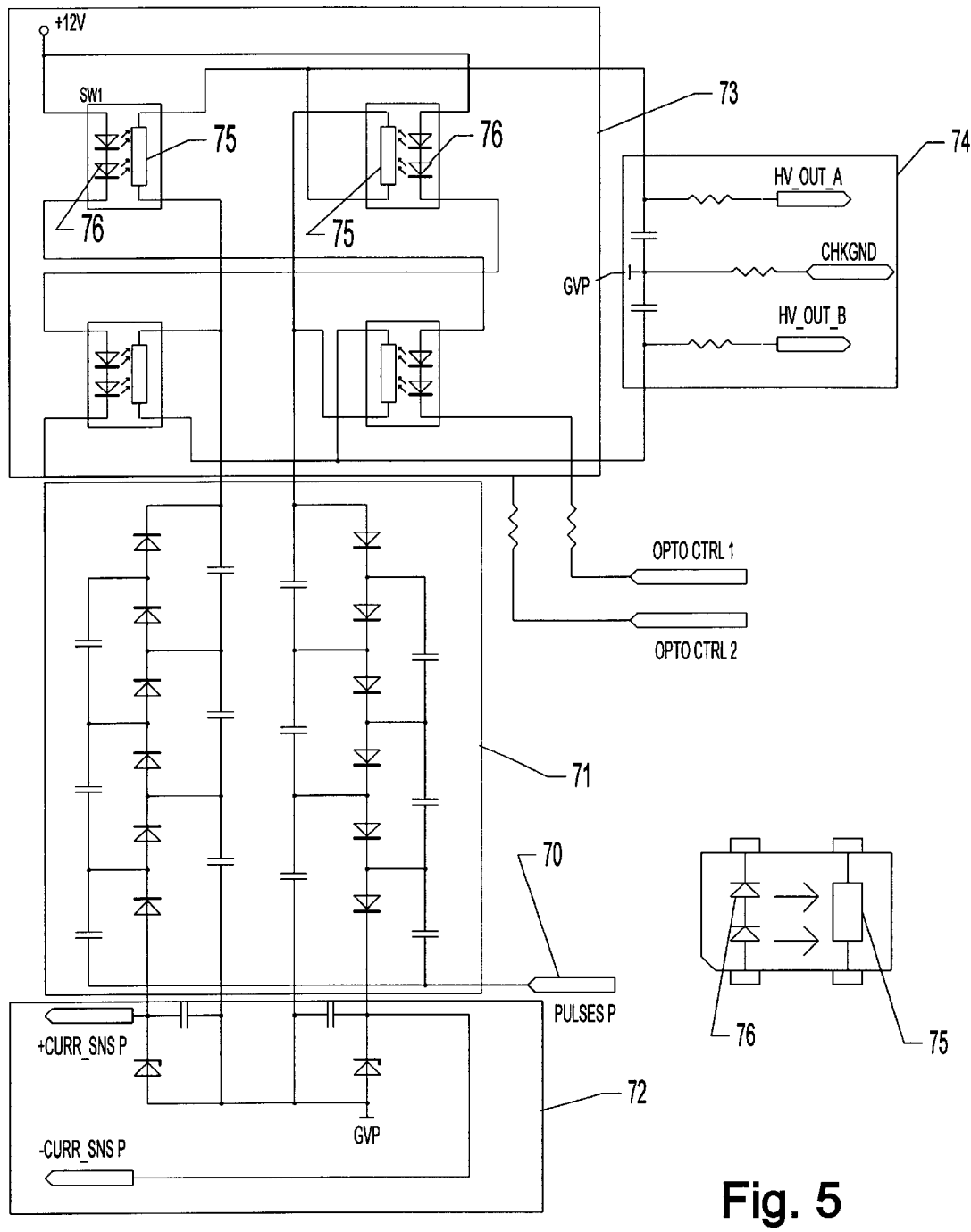
FIG. 5 illustrates a schematic representation an embodiment of an efficient bipolar high voltage electrostatic gripper device of the present invention.

A high voltage circuit embodiment which is capable of delivering bipolar, accurately controllable outputs up to ±6 kV and which attains all of the above objectives is shown in FIG. 5, wherein high voltage pulses of up to 700V amplitude derived from a small transformer are applied to the input 70 of a dual-polarity voltage multiplier network 71. Use of a small transformer combined with a voltage multiplier avoids the relatively poorer efficiencies obtained with very high voltage but high capacitance transformer windings. A current sensing network 72 permits the current flow in both channels to be monitored. The opposite-polarity outputs of the voltage multipliers are switched between the chuck drive electrode wires 74 using a high voltage opto-coupler bridge circuit 73. These optocouplers use Light Emitting Diodes (LEDs) 76 to illuminate a photoconductive semiconductor material with high breakdown voltage 75. The semiconductor conductivity falls with increasing illumination, yielding both switching of the output polarities and linear control of voltages in between, with millisecond time response. Additional and longer term control of output voltage is attained through amplitude variation of the pulses impressed upon the multiplier input 70. We have found that for semi-insulating GaAs semiconductor bars with a face geometry of 10 mm×3 mm, more than 12 kV breakdown strength and switching to 2 MΩ resistance with 5 mA of LED current can be attained. The end result is a fast-response, high voltage linearly controllable bipolar gripper drive with high efficiency.

Accurate sensing of wafer grip status is one of the tasks that can be accurately performed by the high voltage first unit. Methods of sensing include measurement of gas pressure, gas flow, capacitance between electrodes, capacitance on one electrode, light reflection movements, alterations in light reflection amplitude through interference or simple geometric movement, and sound reflection from the gripper-substrate boundary. Capacitance measurement may be further subdivided into measurement of phase and amplitude changes of a fixed-frequency sensing signal, and measurement of frequency changes of an oscillator that includes the electrodes and substrate in its resonant circuit. All of these methods are especially suited to electronic sensors that are mounted on the gripper device, and so would be improved through the use of this invention.

Figure 6:
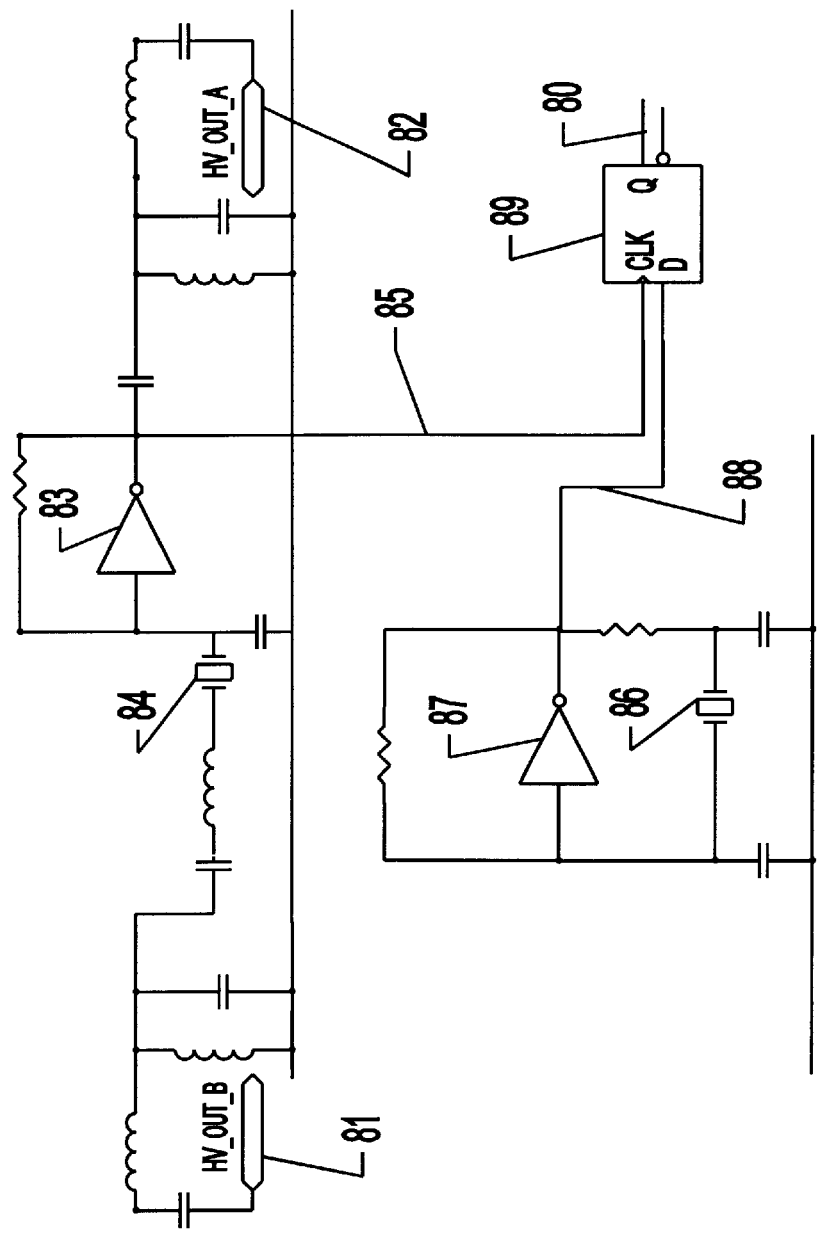
FIG. 6 illustrates a schematic representation an embodiment of a capacitive sense oscillator system of the present invention.

An embodiment that exemplifies frequency change measurement caused by capacitive changes between the grip electrodes is described here, with reference to FIG. 6. The grip electrodes connect to points 81 and 82, completing a crystal oscillator feedback loop including crystal 84 and inverter 83. Changes in oscillation frequency of the crystal oscillator output 85 occur due to capacitance changes in the chuck electrodes, caused by small changes of position due to flexure and clamping of the substrate on the gripper surface. Thus this frequency can monitor substrate grip status. The circuit shown can also operate without a crystal, in which case the changes of frequency are larger but at a less predictable value. A second crystal oscillator may be used as a reference or beat frequency source, and comprises inverter 87 with crystal 86. The output 88 of this second oscillator may be used to decrease the frequency of the first oscillator output 85 in cases where that output frequency is higher than can be measured with the available hardware; and also may be used to generate very low frequency beat signals from a crystal controlled first oscillator to enable period measurements to be made, enhancing the accuracy of frequency shift measurement. In either case the mixed signal is obtained from the output of a phase-sensitive mixer such as an Exclusive-OR gate, or of a D flip-flop 89, as shown in FIG. 6. The output beat frequency 80 may then be applied to a period or frequency (time between pulses or pulse-counting for a given time, respectively) input on common microprocessors. This circuit has shown itself capable, both using crystal locked oscillators and using one free-running oscillator, to yield chuck capacitance change resolution of one part in 2000. For a beat frequency of $f_b = f_1 - f_2$, and a period measurement clock frequency of $f_p$, a frequency resolution of approximately $f_b^2/f_p$ is obtained where $f_1$ is one oscillator frequency, $f_2$ is a second oscillator frequency, and $f_b$ is much smaller than $f_p$. In the case of two crystal locked oscillators, frequency changes as small as 0.04 Hz may be detected within a 30 ms acquisition time using a 2 MHz clock. Practical oscillator and beat frequency generating systems must be designed with low phase jitter to attain this level of performance. Correspondingly high substrate sensing resolutions are possible when oscillator frequencies are selected in the 1 MHz to 15 MHz range, due to the high sensitivity of oscillators in this range to small capacitance and inductance variations. Higher frequency oscillators than 15 MHz are also sensitive, but oscillator power requirements may become excessive in the context of the first high voltage unit being operated in vacuum. Lower frequencies yield poorer resolution due to the smaller number of useful data bits obtained in the allowable measurement time. However longer measurement times, if available, would enable lower sensing frequencies than 1 MHz to be used. The high performance sensing system described above is not applicable to the prior art systems illustrated in FIG. 1. Even at sensing frequencies as low as 400 kHz the prior art configuration pictured in FIG. 1 exhibits high sensitivity to movement of the long connecting cables and system grounding variations.

Data transmission between the first and second units may be accomplished using optical fiber communications which would be appropriate for some extreme high voltage applications such as 100 keV to 2 MeV ion implantation, and which may also employ optical power transfer from the second to the first electronic units.

In the more common transformer coupled embodiments, data transmission is more economically achieved through the same transformers used for power transfer. Amplitude modulation of the power waveform was described earlier in the context of adaptive power transfer through variable transformer couplings, and can be used for communication of signals from the power and control unit to the high voltage generator unit with minimal circuit complexity.

It is also possible to use a high frequency signal coupled primarily either magnetically (through the transponder magnetic cores) or electromagnetically (through space). Whether the magnetic or electromagnetic components of signal transmission will dominate in a particular case depend on system and wiring geometry and the signal frequency, with higher frequencies tending to be coupled electromagnetically more easily. This high frequency signal differs from the typical 20 kHz–2 MHz power coupling frequencies, and can be modulated in amplitude, frequency, phase, and many combinations of these basic modulation types. In this description, magnetic coupling of such signals will be deemed to include mixtures of magnetic and electromagnetic coupling.

Return data transmission from the high voltage unit to the power and control unit can similarly use a different high frequency, or time-share the same high frequency used by the power and control unit. In one embodiment we have used power frequencies which can range between 200 and 600 kHz, with amplitude modulation of this power frequency for data transmission to the high voltage unit. In the return direction an amplitude modulated 8 MHz electromagnetic signal is superimposed upon the power lines 41 and 42, then received by the power and control unit.

Many other similar combinations and expansions of signalling methods will be apparent to the reader. For example in the case of several electrostatic gripper systems installed in one process apparatus, interference between signals from different high voltage units could be minimised using various transmission frequencies such as 8 MHz, 8.1 MHz, 8.2 MHz etc. Alternatively, interference could be minimised using a ring-polling system whereby each unit is polled for data while the other units remain silent.

What is claimed is:

1. An electronic system used for the purpose of holding substrates comprising:
   (a) an electrostatic gripper surface;
   (b) a first electronic unit mounted in proximity to the electrostatic gripper which generates at least one high voltage output connected to an electrostatic gripper electrode;
   (c) a coupling device containing transponder elements enabling power to be supplied to the first electronic unit and permitting data signal exchange with the first electronic unit, the first electronic unit being in connection with the coupling device by only two wires; and
   (d) a second electronic unit mounted in proximity to control and power connections of the processing apparatus, which provides power through said coupling device to the first electronic unit and performs data exchange through the coupling device with the first electronic unit.

2. The system of claim 1 wherein the first electronic unit provides one high voltage output.

3. The system of claim 1 wherein the first electronic unit provides two high voltage outputs.

4. The system of claim 1 wherein the coupling device may cease operation, disconnecting the first and second electronic units, and where the first electronic unit contains energy storage means permitting gripper operation while the connection is broken.

5. The system of claim 4 wherein the coupling device transponder elements include at least one plug and at least one socket forming a direct connection that may be broken during gripper operation.

6. The system of claim 1 wherein the coupling device contains at least one pair of functioning transponder elements in noncontacting electromagnetic connection.

7. The system of claim 6 wherein the coupling device contains an optical data link.

8. The system of claim 6 wherein the coupling device contains an optical power link.

9. The system of claim 6 wherein the coupling device contains a magnetic data link.

10. The system of claim 6 wherein the coupling device contains a magnetic power link.

11. The system of claim 6 wherein the coupling device contains at least one transformer with two windings so disposed as to provide a gap between the windings.

12. The system of claim 11 wherein the coupling device consists of one transformer.

13. The system of claim 11 wherein the coupling device consists of two transformers.

14. The system of claim 11 wherein the coupling device consists of three transformers.

15. The system of claim 11 wherein the coupling device consists of four transformers.

16. The system of claim 11 wherein the power signal coupled is in the range 20 kHz to 2 MHz.

17. The system of claim 16 wherein the power signal coupled is in the range 200 kHz to 600 kHz.

18. The system of claim 11 wherein data transfer between the first and second electronic units is performed by modulation of signals impressed upon the transformer windings.

19. The system of claim 18 wherein said data transfer is performed by modulation of signals in the range of 1 MHz to 20 MHz in at least one data transfer direction.

20. The system of claim 18 wherein said data transfer from the second to first electronic unit is performed by modulation of the power transfer waveform.

21. The system of claim 11 wherein the power drive from the second unit to the coupling device contains an adaptive feedback circuit which permits resonance of the power drive signal with the coupling device inductance and the other circuit capacitances.

22. The system of claim 21 wherein the power drive adaptive feedback circuit contains a power output limiting device.

23. The system of claim 22 wherein the power output limiting device permits amplitude modulation of the power signal for the purposes of data transfer to the first electronic unit.

24. The system of claim 1 wherein the first electronic unit employs a voltage switching half bridge optocoupler pair to obtain a reversible polarity high voltage output with high power efficiency.

25. The system of claim 24 wherein the optocouplers employ semi-insulating GaAs material as a photoconductor.

26. The system of claim 24 wherein the first electronic unit employs a capacitor-diode voltage multiplier system to obtain high efficiency high voltage output from relatively low-voltage input pulses.

27. The system of claim 1 wherein substrate position sensing is performed using an oscillator connected such that variations in chuck capacitance cause oscillator frequency shifts which are detected using at least one of period and frequency measurement techniques.

28. The system of claim 27 wherein the oscillator is connected to one electrostatic gripper electrode.

29. The system of claim 27 wherein the oscillator is connected between two electrostatic gripper electrodes.

30. The system of claim 29 wherein the oscillator frequency is in the range of 400 kHz to 15 MHz.

31. The system of claim 30 wherein the oscillator frequency is in the range of 2 MHz to 10 MHz.

32. An electronic system used for the purpose of holding substrates comprising:

(a) an electrostatic gripper surface (b) a first electronic unit mounted in proximity to the electrostatic gripper which generates at least one high voltage output connected to an electrostatic gripper electrode;

(c) a coupling device containing transponder elements enabling power to be supplied to the first electronic unit and permitting data signal exchange with the first electronic unit, the coupling device contains at least one pair of functioning transponder elements in non-contacting electromagnetic connection, the pair of transponder elements transmitting both power and data therebetween; and (d) a second electronic unit mounted in proximity to control and power connections of the processing apparatus, which provides power through said coupling device to the first electronic unit and performs data exchange through the coupling device with the first electronic unit.

* * * * *